United States Patent
Oh et al.

(10) Patent No.: US 7,551,658 B2
(45) Date of Patent: Jun. 23, 2009

(54) BURIED RIDGE WAVEGUIDE LASER DIODE

(75) Inventors: Su Hwan Oh, Daejeon (KR); Ki soo Kim, Daejeon (KR); Oh Kee Kwon, Daejeon (KR); Yong soon Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/633,739

(22) Filed: Dec. 5, 2006

(65) Prior Publication Data

US 2007/0076773 A1    Apr. 5, 2007

(30) Foreign Application Priority Data

Dec. 8, 2005    (KR) .................. 10-2005-0120175

(51) Int. Cl.
    *H01S 5/00*    (2006.01)
(52) U.S. Cl. .............. 372/46.01; 372/45.01; 372/44.01; 372/43.01
(58) Field of Classification Search .............. 372/46.01, 372/45.01, 44.01, 43.01
    See application file for complete search history.

(56) References Cited

U.S. PATENT DOCUMENTS

| | | | | |
|---|---|---|---|---|
| 5,574,743 A | * | 11/1996 | van der Poel et al. | 372/46.01 |
| 5,604,764 A | * | 2/1997 | Motoda et al. | 372/46.01 |
| 5,793,788 A | * | 8/1998 | Inaba et al. | 372/45.01 |
| 6,304,587 B1 | | 10/2001 | Zah | |
| 2002/0145149 A1 | * | 10/2002 | Kim et al. | 257/90 |

FOREIGN PATENT DOCUMENTS

| | | |
|---|---|---|
| JP | 2003-298185 | 10/2003 |
| KR | 100279734 | 11/2000 |
| KR | 100330593 | 3/2002 |

OTHER PUBLICATIONS

Oh, Su Hwan, et al., "Fabrication and Characterization of InGaAsP/InP Multi-Quantum Well Buried-Ridge Waveguide Laser Diodes", Dec. 2003, *Buried-Ridge Waveguide Laser Diode*, vol. 14, No. 6.
Hamamoto, Kiichi, et al., "High-Power 0.98μm Strained Quantum-Well Lasers Fabricated Using In Situ Monitored Reactive Ion Beam Etching", Jun. 1995, *IEEE Phototronics Technology Letters*, vol. 7, No. 6.

* cited by examiner

*Primary Examiner*—Armando Rodriguez
*Assistant Examiner*—Kinam Park
(74) *Attorney, Agent, or Firm*—Ladas & Parry LLP (57) ABSTRACT

Provided is a buried ridge waveguide laser diode that has improved temperature characteristics and can reduce optical loss by a leakage current. The buried ridge waveguide laser diode includes: a ridge region that extends vertically with a constant width and is composed of a selective etching layer and a first compound layer formed of a first conductive type material on a portion of the clad layer; and a p-n-p current blocking layer that has a thickness identical to the depth of the ridge region on the clad layer outside the ridge region and includes a second compound layer formed of a second conductive type material opposite to the first conductive type material. At this time, the current blocking layer includes the first compound layer extending on the second compound layer.

20 Claims, 6 Drawing Sheets

BURIED RIDGE WAVEGUIDE LASER DIODE

CROSS-REFERENCE TO RELATED PATENT APPLICATION

This application claims the benefit of Korean Patent Application No. 10-2005-0120175, filed on Dec. 8, 2005, in the Korean Intellectual Property Office, the disclosure of which is incorporated herein in its entirety by reference.

BACKGROUND OF THE INVENTION

1. Field of the Invention

The present invention relates to a laser diode, and more particularly, to a buried ridge waveguide laser diode having a current block layer.

2. Description of the Related Art

Optical waveguide structures of laser diodes can be generally divided into gain guiding types and index guiding types according to the principle of forming a guiding beam in a lateral direction. The index guiding types can further be divided into strongly index guiding types and weakly index guiding types according to the structure of the diode. The strongly index guiding type has a structure in which an active layer that generates an optical gain is formed to have a limited width in the lateral direction so that an optical gain and an optical guide can be generated in a particular active layer. A buried hetero-structure is a representative structure of the strongly index guiding type. The weakly index guiding type diode has a structure in which identical active layers are formed in the lateral direction and an additional structure that changes refractive index is included on or below the active layer. The weakly index guiding type diode indirectly guides an optical beam using the additional structure, and can be of two types: a ridge type and a rib type.

The weakly index guiding type waveguide diode of the buried ridge type can be formed by one growing and etching process. Accordingly, the weakly index guiding type waveguide diode is easy to manufacture, and has uniform characteristics, high reliability. Also, since the weakly index guiding type waveguide diode has a low electrostatic capacity, it can be operated at high speed.

However, the weakly index guiding type has a large threshold current when compared to the strongly index guiding type due to lateral carrier spreading or diffusion, and the realization of lateral direction single mode characteristics is difficult since the width of the guide is narrow. To obtain the lateral direction single mode characteristics, the width of the ridge must be manufactured as narrow as possible. However, since it is difficult to deposit an electrode using a photolithography etching process after a window is opened, manufacturing a ridge weakly index guiding-laser diode (RWG-LD) having 3 μm or less is difficult. Also, when the ridge region is formed, there is a step difference between the ridge region and regions outside the ridge region. To remove the step difference, a thick metal layer must be formed on the regions outside the ridge region by plating a metal or a polyimide material. The maximum width of the ridge to obtain the lateral direction single mode characteristics, although it can be slightly increased by reducing the thickness of the active layer, is known to be approximately 5 μm. If the width of the ridge is greater than the above limit, a lateral multi-mode occurs, and eventually, the utilization of the diode is difficult due to a kink phenomenon.

Figure 1:
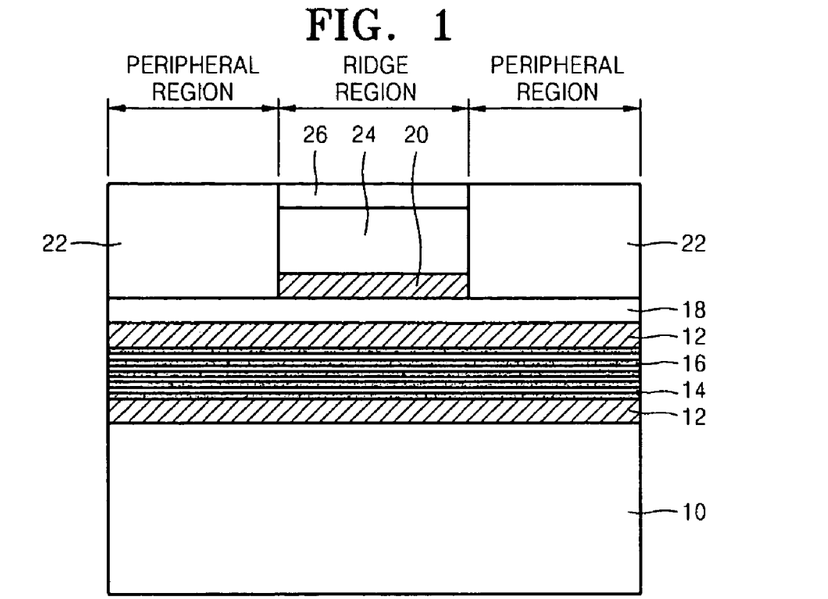
FIG. 1 is a cross-sectional view of a structure of a ridge type waveguide laser diode disclosed in Journal of the Optical Society of Korea vol. 12, no. 4, pp 312-319, 2001.

To solve the problems of the weakly index guiding structure, that is, the ridge type laser diode, a new structure has been proposed in Journal of the Optical Society of Korea vol. 12, no. 4, pp 312-319, 2001. Also, this article discloses the results of optimization of a weakly index guiding structure. FIG. 1 is a cross-sectional view of the structure of a ridge type waveguide laser diode disclosed in the above article.

Referring to FIG. 1, the laser diode has a structure in which regions outside the ridge region (peripheral region) are filled with indium phosphate (InP) having a relatively high refractive index (refractive index of InP=3.17), and the lateral direction refractive index is controlled according to the thickness of InGaAsP 24 additionally grown in the ridge region. For reference, in a conventional ridge type waveguide laser diode, the regions outside the ridge region are filled with a material having small refractive index such as air (refractive index=1) or polyimide (refractive index=1.8). The regions outside the ridge region are filled with an n-type current blocking layer 22. Therefore, a current is injected only into the ridge region. This laser diode is a weakly index guiding structure since the active layer is not limited in the lateral direction and the optical beam is guided according to the structure of the InGaAsP formed on the active layer. Also, this diode is referred to as a buried ridge waveguide laser diode since the ridge region is buried in the current blocking layer 22.

In the above structure, the lateral direction refractive index can be controlled by controlling the thickness of the InGaAsP. Therefore, the lateral direction single mode characteristics can be obtained in a relatively wide ridge width, for example, 6 to 9 μm. Also, since the regions outside the ridge region are filled with a current blocking layer, the conventional polyimide process or a metal plating process is unnecessary. According to the structure and a design method proposed in the above article, the operation of the lateral direction single mode is possible when the width of the ridge region is approximately 7 μm.

In forming a lateral direction single mode, the buried ridge waveguide laser diode can be operated with a relatively larger ridge width when compared to a conventional ridge type waveguide laser diode. Also, when the ridge region of the buried ridge type waveguide laser diode is formed, it can be readily formed since the conventional polyimide process or the metal plating process is unnecessary.

In the buried ridge type waveguide laser diode, a current flows only into a limited region, that is, the ridge region due to the n-p InP layer (the n-p current blocking layer) in the regions outside the ridge region. However, the current density in the ridge region is increased since the current is injected only into the limited region. The increased current density increases the thermal resistance and series resistance in the ridge region, thereby reducing the light emission characteristics, particularly, the temperature characteristics. Also, the optical loss increases due to a leakage current through a bonding area between the n-p InP layer and the p-InP layer.

SUMMARY OF THE INVENTION

The present invention provides a buried ridge type waveguide laser diode that has increased temperature characteristics and can reduce optical loss caused by a leakage current.

According to an aspect of the present invention, there is provided a buried ridge waveguide laser diode comprising: a clad layer disposed on an active layer; a ridge region that vertically extends with a constant width and is composed of a selective etching layer and a first compound layer formed of a first conductive type material on a portion of the clad layer; and a p-n-p current blocking layer that has a thickness identical to the depth of the ridge region on the clad layer outside the ridge region and comprises a second compound layer formed of a second conductive type material opposite to the first conductive type material, wherein the current blocking layer comprises the first compound layer extending on the second compound layer.

The selective etching layer may be formed on the clad layer in the ridge region to a predetermined thickness, and may be a layer formed of at least one selected from p-InGaAs, p-InGaP, and p-GaAs. The selective etching layer may have a width of 6 to 9 μm.

The buried ridge waveguide laser diode may further comprise an ohmic contact layer on a front surface of the first compound layer.

The current blocking layer may be formed by sequentially stacking the clad layer, the second compound layer, and the first compound layer, and the clad layer, the second compound layer, and the first compound layer may be respectively formed of p-InP, n-InP, and p-InP.

The current blocking layer may be formed by sequentially stacking the second compound layer, the first compound layer, and the ohmic contact layer.

The second compound layer, the first compound layer, and the ohmic contact layer may be respectively formed of p-GaAs, n-GaAs, and p-GaAs, p-AlGaAs, n-AlGaAs, and p-AlGaAs, or p-InGaP, n-InGaP, and p-InGaP.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their repetitive descriptions will be omitted.

EMBODIMENT

Figure 2:
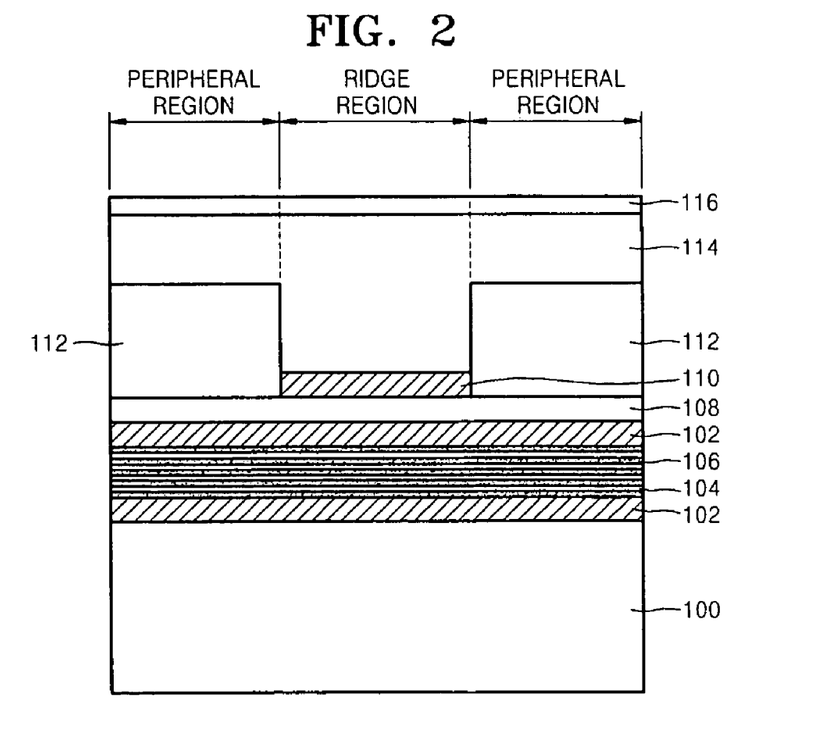
FIG. 2 is a cross-sectional view of a buried ridge type waveguide laser diode (B-RWG LD) according to an embodiment of the present invention.

FIG. 2 is a cross-sectional view of a B-RWG LD according to an embodiment of the present invention. The B-RWG LD includes a p-n-p current blocking layer in regions outside the ridge region unlike in a conventional structure. For convenience, the B-RWG LD structure proposed in the present invention will be referred to as B-RWG LD II.

Referring to FIG. 2, in the B-RWG LD II, a wave guiding layer 102 is disposed on a substrate 100 such as an InP substrate or a GaAs substrate, and a clad layer 108 is disposed on active layers 104 and 106. A ridge region that vertically extends with a constant width and is composed of a selective etching layer 110 and a first compound layer 114, which is of a first conductive type, is formed on a portion of the clad layer 108. A second compound layer 112, which is a of second conductive type opposite to the first conductive type and has a thickness identical to the depth of the ridge region, is formed on the clad layer 108 of the regions outside the ridge region. The first compound layer 114 of the ridge region is extended to cover the second compound layer 112. An ohmic contact layer 116 is disposed on the entire surface of the first compound layer 114.

The selective etching layer 110 can be formed to a predetermined thickness on the clad layer 108 in the ridge region. The selective etching layer 110 may be formed of a single compound or at least one material selected from p-InGaAs, p-InGaP, and p-GaAs. Also, the selective etching layer 110 can have a width of 6 to 9 μm.

A current blocking layer can be formed of a material selected from InP, GaAs, AlGaAs, and InGaP. In the present invention, the current blocking layer can be of two types.

The current blocking layer of the first type can be formed by sequentially stacking the clad layer 108, the second compound layer 112, and the first compound layer 114. At this time, the current blocking layer can be a p-n-p current blocking layer respectively formed of p-InP, n-InP, and p-InP.

The current blocking layer of the second type can be formed by sequentially stacking the second compound layer 112, the first compound layer 114, and the ohmic contact layer 116. At this time, the current blocking layer can be formed of p-GaAs, n-GaAs, and p-GaAs, or p-AlGaAs, n-AlGaAs, and p-AlGaAs. Also, the current blocking layer can be a p-n-p current blocking layer formed of p-InGaP, n-InGaP, and p-InGaP.

The B-RWG LD II according to the present invention has a reduced current density when compared to the prior art due to the relatively wide first compound layer 114, for example, the p-InP layer. When the current density is reduced, the temperature characteristics can be increased. Also, the p-n-p current blocking layer according to the present invention has a better current blocking efficiency than a conventional n-p current blocking layer, thereby reducing optical loss caused by a leakage current.

Next, a method of manufacturing the B-RWG LD II according to the present invention will now be described. To manufacture the B-RWG LD II, a multi quantum well (MQW) epitaxy layer is grown using a MOCVD method. The epitaxy layer of the RWG LD I includes the optimized structure shown in FIG. 1, if necessary.

Figure 3:
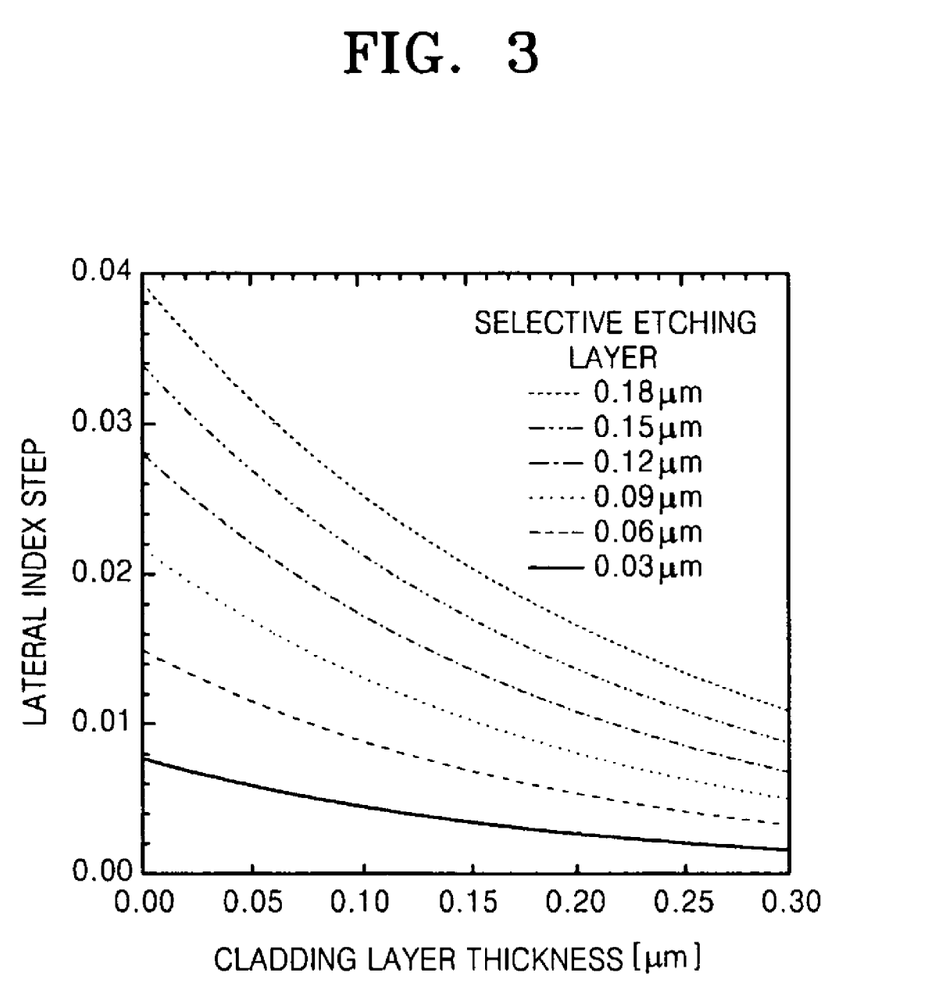
FIG. 3 is a graph showing measurement results of lateral direction refractive index of the structure of the ridge type waveguide laser diode disclosed in FIG. 1.

FIG. 3 is a graph showing measurement results of lateral direction refractive index of the optimally designed structure of the ridge type waveguide laser diode shown in FIG. 1. Referring to FIG. 3, when the clad layer 108, for example, a p-InP layer has a thickness of 0.15 μm, the thickness of the selective etching layer 110, for example, an InGaAsP layer, must be greater than 900 Å to maintain the effective refractive index greater than 0.01 for operating a lateral direction single mode. Accordingly, the selective etching layer 110 was grown to approximately 1000 Å. The thickness, refractive index, and compositions of the epitaxy layers grown under the above conditions are summarized in Table 1.

TABLE 1

| | Layer | Thickness (μm) | Refractive index | Composition of layer (InP type current blocking layer) | |
|---|---|---|---|---|---|
| $\|x\| \leqq w/2$ | First compound layer | 1.5 | 3.17 | p-InP | |
| | Selective etching layer | 0.1 | 3.37 | InGaAsP(1.25 μm) | |
| $\|x\| > w/2$ | Second compound layer | 1.5 | 3.17 | n-InP | |
| | Clad layer | 0.15 | 3.17 | p-InP | |
| | Wave guiding layer | 0.1 | 3.37 | InGaAsP($\lambda_g$ = 1.25 μm) | |
| | Active layer | 0.1 | 3.56 | Well layer | InGaAsP(1.55 μm) |
| | | | 3.37 | Barrier layer | InGaAsP(1.25 μm) |
| | Substrate | >10 | 3.17 | n-InP | |

At this time, five pairs of the active layers, each pair including the lattice matched well layer 114, for example, an InGaAsP layer and the barrier layer 116, for example, an InGaAsP($\lambda$=1.25 μm) layer are respectively grown to a thickness of 60 Å and 100 Å. The clad layer 108, for example, a p-InP layer, is formed to a thickness of 1.5 μm, and the ohmic contact layer 116, for example, a p-InGaAs layer, is formed to a thickness of 0.2 μm. The doping concentration of each of the clad layer 108, the selective etching layer 110, and the first compound layer 114 is $7\times10^{17}/cm^3$, and the doping concentration of the ohmic contact layer 116 is $5\times10^{18}/cm^3$. The wave guiding layer 102 and the active layers 104 and 106 are not doped.

Next, a SiNx mask (not shown) having a stripe shape with a width of 5 μm or 7 μm is formed using a photolithography method on the substrate where the epitaxy layers are formed. Afterward, the p-InGaAsP layer is etched using a solution made of $H_2SO_4:H_2O_2:H_2O=3:1:1$ for 30 seconds, and the p-InP layer is etched using a solution made of HCl: $H_3PO_4$=1:4 for 3 minutes. The 1.25 μm InGaAsP layer is etched using a solution made of $H_2SO_4:H_2O_2:H_2O=3:1:1$ for 30 seconds. The etching is continued until the selective etching layer 110 is exposed, and the clad layer 108 is not etched. Accordingly, a ridge is formed on the clad layer 108.

Next, the second compound layer 112, for example, an n-InP layer, is re-grown on peripheral regions of the clad layer 108 on which the ridge region is formed using the MOCVD method. Afterward, the SiNx mask (not shown) and the p-InGaAs layer which is the ohmic contact layer 116 are removed, and the p-InP layer 114 and the p-InGaAs layer, which is the ohmic contact layer 116, are re-grown (third time) using the MOCVD method.

A Ti (approximately 300 Å)/Pt (approximately 200 Å)/Au (approximately 4000 Å) is deposited as a p-side electrode of the substrate 100 using an E-beam depositor. Next, the p-side electrode is annealed at a temperature of approximately 425° C. for 30 seconds under a 10% $H_2/N_2$ gas atmosphere in a rapid thermal annealing (RTA) apparatus. A Cr (approximately 500 Å)/Au (approximately 5000 Å) is deposited as an n-side electrode of the substrate 100 using an E-beam depositor. The n-side electrode is annealed at a temperature of approximately 400° C. for 30 seconds.

COMPARATIVE EXAMPLE

A structure RWG LD I illustrated in the comparative example is compared to the embodiment of the present invention. The structure RWG LD I is designed based according to FIG. 1. The structure RWG LD I can be obtained by completing the second growing in the course of manufacturing the B-RWG LD II.

The physical properties of the structure B-RWG LD II according to an embodiment of the present invention and the structure RWG LD I according to a comparative example will now be described.

(1) Comparison of I-L Characteristics According to the Length of a Cavity

Figure 4:
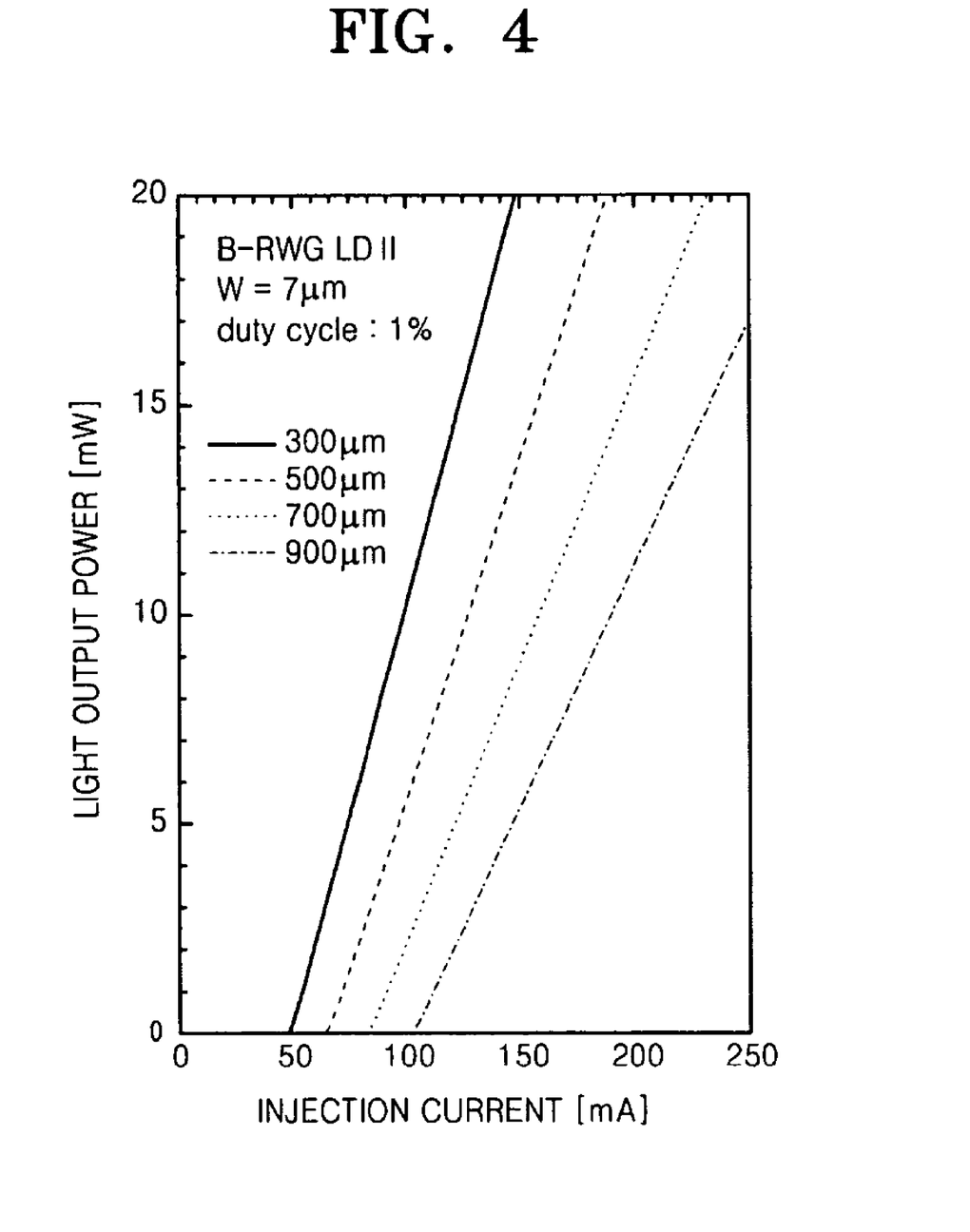
FIG. 4 is a graph showing characteristics of injected current and optical output (I-L) according to the length of a cavity of a B-RWG LD II according to an embodiment of the present invention.

FIG. 4 is a graph showing characteristics of injected current and light output power (I-L) according to the length of a cavity of the structure B-RWG LD II according to an embodiment of the present invention. In the experiment for measuring the I-L characteristics of the structure B-RWG LD II, a frequency cycle of 1% having a pulse frequency of 1 ms and a pulse width of 10 μs is used to prevent the reduction of light output power by Joule heat.

Referring to FIG. 4, a kink phenomenon due to a multi-dimensional mode operation does not occur until the output reaches the 20 mW. Accordingly, the B-RWG LD II operates in a lateral single mode at a ridge width of 7 μm. Also, when the length of the cavity is 300 μm, it is seen that the operational critical current is 48 mA. However, the structure RWG LD I of the comparative example has a critical current of 3 to 5 mA greater than the structure B-RWG LD II.

Figure 5:
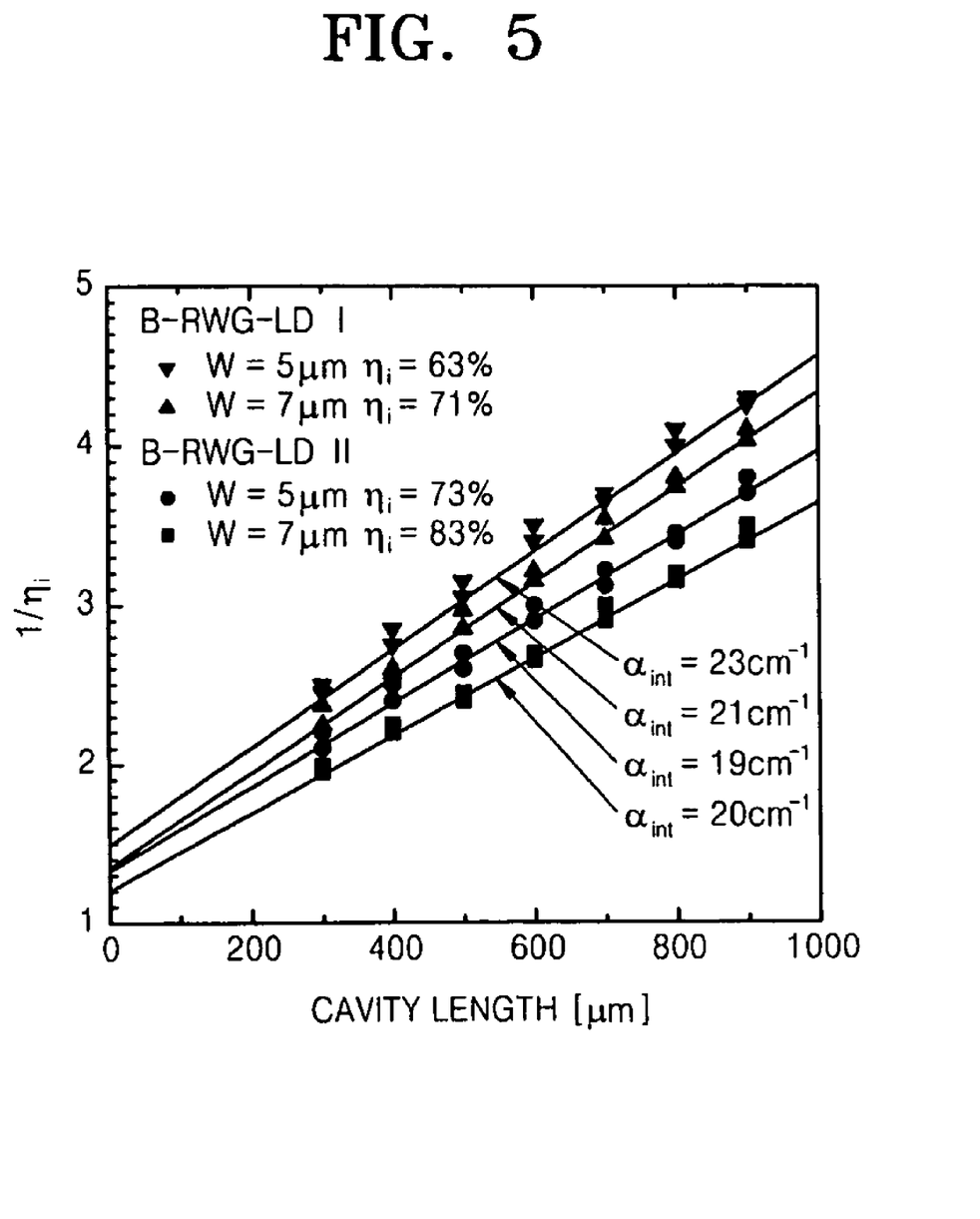
FIG. 5 is a graph showing internal quantum efficiency and internal loss according to ridge widths of a conventional B-RWG LD I and a B-RWG LD II according to an embodiment of the present invention.

(2) Comparison of Internal Quantum Efficiency and Internal Loss According to the Width of the Ridge FIG. 5 is a graph showing internal quantum efficiency ($\eta_i$) and internal loss ($\alpha_{int}$) according to the ridge widths of a conventional structure B-RWG LD I and a structure B-RWG LD II according to an embodiment of the present invention. The horizontal axis represents the length of the cavity, and the vertical axis represents the inversed external differential quantum efficiency.

Referring to FIG. 5, in the structure RWG LD I, when the widths of the ridge are 5 μm and 7 μm, the internal quantum efficiencies are respectively 63% and 71%, and the internal losses are respectively 23 $cm^{-1}$ and 21 $cm^{-1}$. In the structure B-RWG LD II, when the widths of the ridge are 5 μm and 7 μm, the internal quantum efficiencies are respectively 73% and 83%, and the internal losses are respectively 19 cm$^{-1}$ and 20 cm$^{-1}$. That is, the structure B-RWG LD II has higher internal quantum efficiency than the structure RWG LD I. This is because the carrier injection efficiency into the active layers is higher in the structure B-RWG LD II since, in the structure B-RWG LD II, the loss of injected carrier by a leakage current is small and the loss of carrier by contact resistance in the ohmic contact layer 116 is small.

(3) Comparison of Optical Output According to Injected Current

Figure 6:
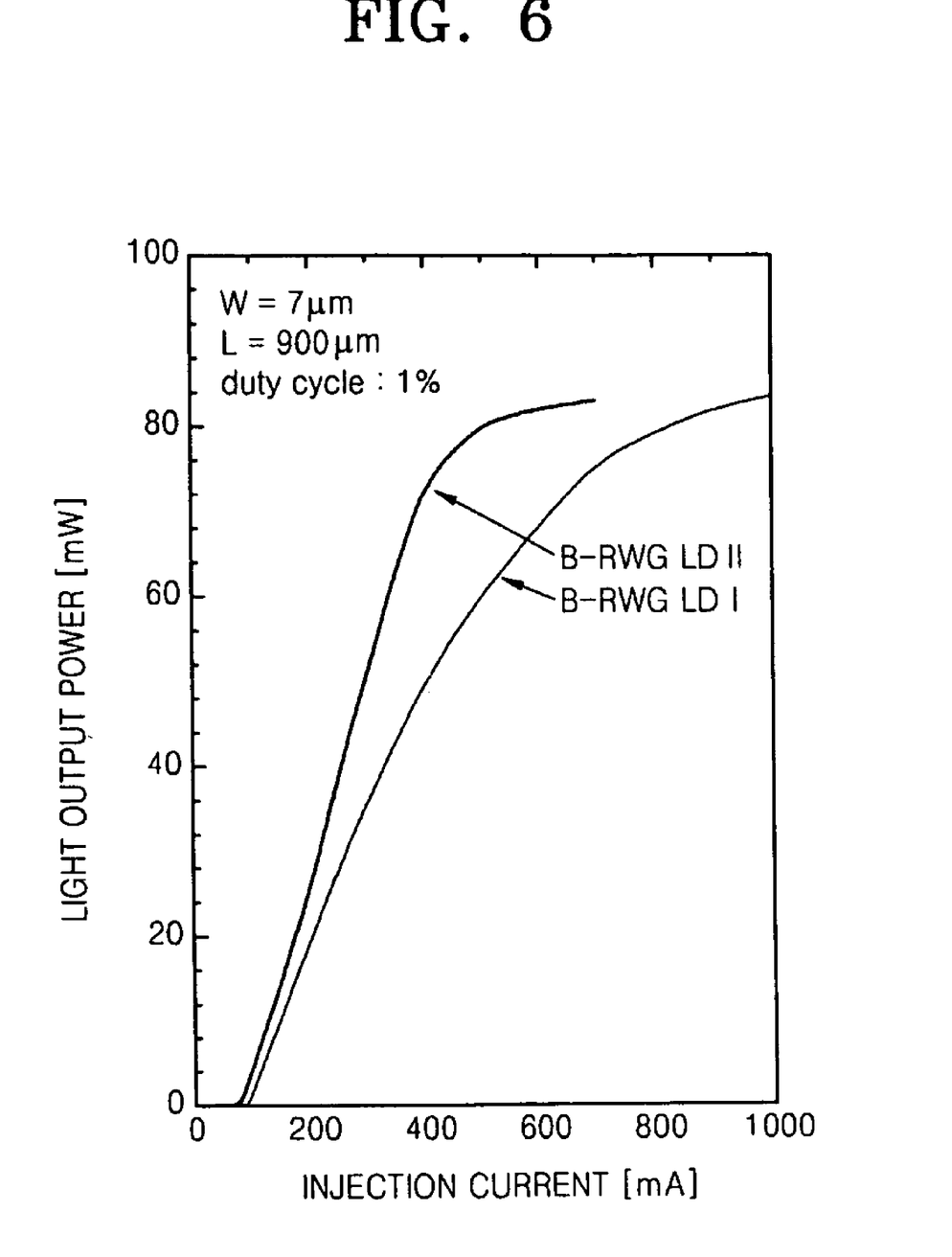
FIG. 6 is a graph showing an optical output according to an injected current of a conventional B-RWG LD I and a B-RWG LD II according to an embodiment of the present invention.

FIG. 6 is a graph showing a light output power according to an injected current of a conventional structure B-RWG LD I and a structure B-RWG LD II according to an embodiment of the present invention. At this time, the laser diode has a width of approximately 7 μm, a length of approximately 900 μm, and a duty cycle of 1%. An exit surface of the laser diode is not coated. The structure B-RWG LD II is advantageous for a high output since the structure B-RWG LD II has an active layer having a wider width than a conventional strong refractive index guiding type. Also, in view of a maximum output, the structure B-RWG LD II has a high catastrophic optical damage (COD) level due to a large beam size. The measurement results of the maximum output of the manufactured structure RWG LD I and the structure B-RWG LD II are shown in FIG. 6.

Referring to FIG. 6, the structure B-RWG LD II has a higher slope efficiency than the structure RWG LD I. The two laser diodes have a saturation output of approximately 80 mW. Since there is no difference in the saturation output between the two laser diodes, it seems that the saturation output does not depend on the optical absorption difference according to the thickness of the clad layer 108, but depends on gain saturation of the active layer itself. The measurements of the light output power are performed without coating the exit surface. Accordingly, a further higher light output power can be obtained when the exit surface is coated with a high reflective film and a non-reflective film.

(4) Comparison of Temperature Characteristics

Figure 7:
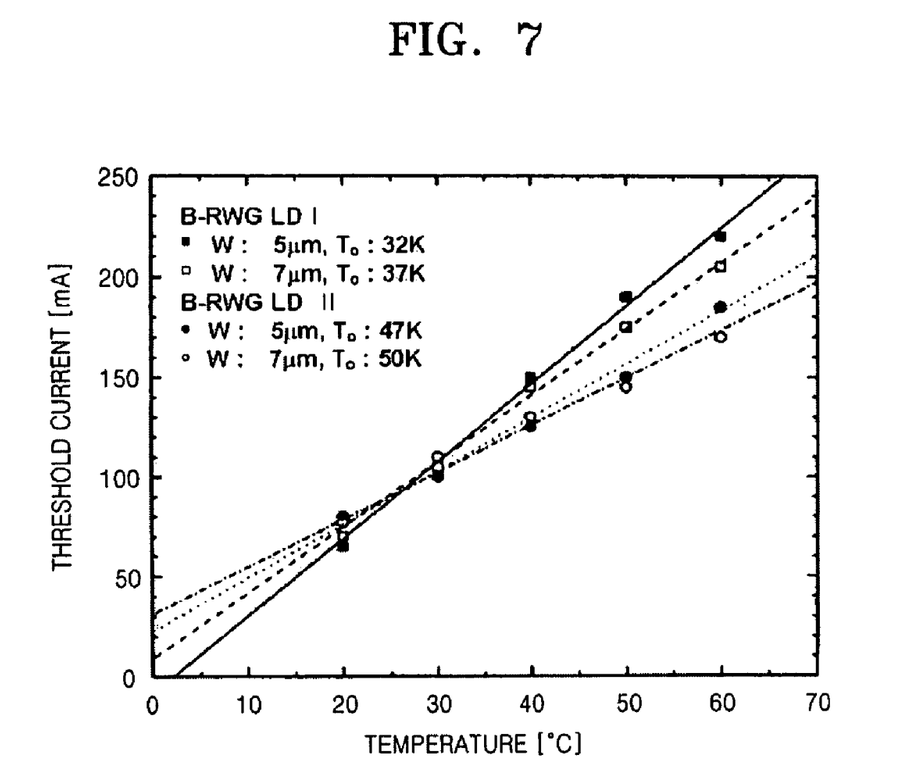
FIG. 7 is a graph showing optical output (I-L) characteristics with respect to an injected current according to temperature of a B-RWG LD II according to an embodiment of the present invention.

FIG. 7 is a graph showing variation of critical current $I_{th}$ according to temperature. $T_o$ is the temperature according to the width of the ridge. Each of the dots in FIG. 7 is the result of measurement and the thread line represents calculated theoretical $T_o$ values.

Referring to FIG. 7, in the structure RWG LD I, when the width of the ridge is 5 μm and 7 μm, the $T_o$ is 32K and 37K, respectively. In the B-RWG LD II, the $T_o$ is 47K and 50K, respectively. That is, the structure B-RWG LD II has a temperature characteristic of 12 to 13K superior to the RWG LD I.

A buried ridge waveguide laser diode according to the present invention has improved temperature characteristic and can reduce optical loss caused by a leakage current by including a p-n-p current blocking layer disposed in regions outside a ridge region.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A buried ridge waveguide laser diode comprising:
a clad layer disposed on an active layer;
a ridge region on the clad layer such that the ridge region extends substantially vertically with a substantially constant width and is consisting of a selective etching layer and a first compound layer, wherein the selective etching layer, the first compound layer and the clad layer exhibit a first conductive type; and
a p-n-p current blocking layer on the clad layer outside the ridge region and comprises
a second compound layer formed on the clad layer and having a thickness substantially identical to the depth of the ridge region and having a second conductive type opposite to the first conductive type; and
the first compound layer extending on and above the second compound layer and extending on and above the ridge region such that a portion of the current blocking layer extends above the ridge region.

2. The buried ridge waveguide laser diode of claim 1, wherein the selective etching layer is formed on the clad layer in the ridge region to a predetermined thickness.

3. The buried ridge waveguide laser diode of claim 1, wherein the selective etching layer is a layer formed of at least one selected from p-InGaAs, p-InGaP, and p-GaAs.

4. The buried ridge waveguide laser diode of claim 1, wherein the selective etching layer has a width of 6 to 9 μm.

5. The buried ridge waveguide laser diode of claim 1, further comprising an ohmic contact layer on a front surface of the first compound layer.

6. The buried ridge waveguide laser diode of claim 1, wherein the current blocking layer is formed of a single compound.

7. The buried ridge waveguide laser diode of claim 6, wherein the current blocking layer is formed of a material selected from InP, GaAs, AIGaAs, and InGaP.

8. The buried ridge waveguide laser diode of claim 4, wherein the current blocking layer comprises the clad layer, the second compound layer, and the first compound layer sequentially stacked together, wherein the clad layer exhibits the first conductive type.

9. The buried ridge waveguide laser diode of claim 8, wherein the clad layer, the second compound layer, and the first compound layer are respectively formed of p-InP, n-InP, and p-InP.

10. The buried ridge waveguide laser diode of claim 5, wherein the current blocking layer comprises the second compound layer, the first compound layer, and the ohmic contact layer, wherein the ohmic contact layer exhibits the second conductive type.

11. The buried ridge waveguide laser diode of claim 10, wherein the second compound layer, the first compound layer, and the ohmic contact layer are respectively formed of p-GaAs, n-GaAs, and p-GaAs.

12. The buried ridge waveguide laser diode of claim 10, wherein the second compound layer, the first compound layer, and the ohmic contact layer are respectively formed of p-AIGaAs, n-AIGaAs, and p-AIGaAs.

13. The buried ridge waveguide laser diode of claim 10, wherein the second compound layer, the first compound layer, and the ohmic contact layer are respectively formed of p-InGaP, n-InGaP, and p-InGaP.

14. A buried ridge waveguide laser diode comprising:
an active layer;
a clad layer on top the active layer, the clad layer exhibiting a first-type of conductive property;
a ridge region on top of the clad layer, the ridge region consisting of a selective etching layer and a first compound layer, the selective etching layer and the first compound layer exhibiting the first-type of conductive property; and
a current blocking layer comprising:

the clad layer, a second compound layer formed on and above the clad layer and having a thickness substantially identical to the depth of the ridge region, and the first compound layer formed on and above the second compound layer and extending on and above the ridge region such that a portion of the current blocking layer extends above the ridge region, wherein the second compound layer exhibits a second-type of conductive property such that the second-type of conductive property is opposite of the first-type of conductive property.

15. The buried ridge waveguide laser diode of claim 14 further comprising a pair of wavelength guiding layers sandwiching the active layer in the middle of the pair of wavelength guiding layers.

16. The buried ridge waveguide laser diode of claim 14 further comprising an ohmic contact layer electrically connected and on top of the first compound layer, the ohmic contact layer exhibiting the first-type of conductive property.

17. The buried ridge waveguide laser diode of claim 16 wherein the first-type of conductive property is p-type conductive property and the second-type of conductive property is n-type conductive property.

18. A buried ridge waveguide laser diode comprising:

an active layer;

a clad layer on top the active layer, wherein the clad layer exhibiting a first type of conductive property;

a ridge region on top of the clad layer, the ridge region consisting of a selective etching layer and a first compound layer, the first compound layer exhibiting the first-type of conductive property; and a current blocking layer on top of the clad layer, the current blocking layer comprising a second compound layer on and above the clad layer, the first compound layer on and above the second compound layer and extending on and above the ridge region such that a portion of the current blocking layer extends above the ridge region, and an ohmic contact layer, on the first compound layer, wherein the second compound layer has a thickness substantially identical to the depth of the ridge region and exhibits a second-type of conductive property wherein the second-type of conductive property is opposite of the first-type of conductive property, and the ohmic contact layer electrically on top of the first compound layer, the ohmic contact layer exhibiting the second-type of conductive property.

19. The buried ridge waveguide laser diode of claim 18 further comprising a pair of wavelength guiding layers sandwiching the active layer in the middle of the pair of wavelength guiding layers.

20. The buried ridge waveguide laser diode of claim 18 wherein the first-type of conductive property is n-type conductive property and the second-type of conductive property is p-type conductive property.

* * * * *